(12) United States Patent
Dornfest et al.

(10) Patent No.: US 7,629,031 B2
(45) Date of Patent: Dec. 8, 2009

(54) PLASMA ENHANCED BONDING FOR IMPROVING ADHESION AND CORROSION RESISTANCE OF DEPOSITED FILMS

(75) Inventors: Charles N. Dornfest, Fremont, CA (US); Deepak Upadhyaya, Fremont, CA (US); William John Boardman, Danville, CA (US); Karthik Boinapally, Fremont, CA (US)

(73) Assignee: Sub-One Technology, Inc., Pleasanton, CA (US)

( * ) Notice: Subject to any disclaimer, the term of this patent is extended or adjusted under 35 U.S.C. 154(b) by 3 days.

(21) Appl. No.: 12/006,188

(22) Filed: Dec. 31, 2007

(65) Prior Publication Data

US 2009/0017222 A1      Jan. 15, 2009

Related U.S. Application Data

(60) Provisional application No. 60/959,360, filed on Jul. 13, 2007.

(51) Int. Cl.
*H05H 1/00* (2006.01)
(52) U.S. Cl. .................................................. 427/535
(58) Field of Classification Search .................. 427/533
See application file for complete search history.

(56) References Cited

U.S. PATENT DOCUMENTS

| | | | | |
|---|---|---|---|---|
| 5,541,003 A | | 7/1996 | Nakayama et al. | 428/408 |
| 5,731,045 A | * | 3/1998 | Dearnaley et al. | 427/527 |
| 6,033,533 A | | 3/2000 | Sugiyama et al. | |
| 6,664,182 B2 | | 12/2003 | Jeng | 438/638 |
| 2006/0196419 A1 | * | 9/2006 | Tudhope et al. | 118/715 |
| 2006/0198965 A1 | | 9/2006 | Tudhope et al. | |

\* cited by examiner

*Primary Examiner*—Roberts Culbert
(74) *Attorney, Agent, or Firm*—Schneck & Schneck; Terry McHugh

(57) ABSTRACT

Plasma Enhanced Bonding (PEB) during a coating process is used to improve both adhesion and corrosion resistance of the resulting coating. New interfacial compounds may be formed, offering the increased resistance to corrosion, as well as enhanced bonding to the workpiece being coated and any subsequently formed layer, such as diamond-like carbon. In one embodiment, the PEB processing is employed during coating of at least one interior surface of the workpiece, which may be a pipe. In a first step, a thin film is deposited. Then, the film is exposed to a high energy etch-back plasma. This two-step cycle of depositing a film and then providing bombardment of the film may be repeated a number of times. Typically, the deposition step of the cycle is much shorter than the bombardment step.

38 Claims, 8 Drawing Sheets

PLASMA ENHANCED BONDING FOR IMPROVING ADHESION AND CORROSION RESISTANCE OF DEPOSITED FILMS

CROSS REFERENCE TO RELATED APPLICATION

This application claims priority from Provisional Application No. 60/959,360, filed Jul. 13, 2007.

TECHNICAL FIELD

The invention relates generally to chemical vapor deposition systems and more specifically to methods and systems for promoting adhesion and corrosion resistance for a coating process.

BACKGROUND ART

The corrosion of industrial piping and other components such as valves and pumps is a major problem in some industries. The oil industry, in particular, faces severely corrosive environments, with corrosive gases and liquids such as $H_2S$ (hydrogen sulfide) at elevated temperatures and pressures. Additionally, these conditions form severe wear and erosion environments. One solution to these issues is to coat a lower grade base material with a high quality coating material having the desired high corrosion and wear-resistant properties. Typically, these types of properties will be found in metal, ceramic and particularly diamond-like carbon coatings.

Stainless steel is one example of a metal alloy that is sometimes coated to improve corrosion resistance. Other expensive specialty alloys, such as Hastelloy and Inconel (both of which are federally registered trademarks of Huntington Alloys Corporation), are commonly used for exhaust piping in not only the semiconductor industry, but in chemical processing industries in general. These alloys exhibit high temperature strength and corrosion resistance. Again, a less expensive base material can be used if a suitable surface coating is applied to the interior surface that is to be exposed to the corrosive environment.

In the application of a corrosion-resistant coating to a pipe or other workpiece, adhesion of the coating material to the workpiece must be considered. For a particular coating material, some base materials more readily adhere to the coating material than others. For example, a coating material of diamond-like carbon (DLC) adheres more readily to smooth stainless steel than to either nickel or a rough surface such as carbon steel. Chemical vapor deposition (CVD) is used in numerous applications in which adhesion and corrosion resistance are critical performance parameters. Historically, adhesion of a coating bonded to a substrate or other workpiece is promoted by careful selection of the activation energy for bonding, selection of temperature, and the application of surface area preparations. Plasma enhanced CVD (PECVD) enables depositing films at reduced temperatures, but the energy delivered by plasma typically is not sufficient to provide the desired level of adhesion.

U.S. Pat. No. 6,664,182 to Jeng describes a method of improving the adhesion between organic, low k layers of a dual damascene process using a shallow ion-implantation process, which is described as making the low k layer more dense and increasing the dangling bonds. The method description is limited to low k layers on semiconductor substrates and not described for DLC coatings on steel substrates, also ion implantation techniques cannot be applied to internal surfaces as they are limited to line-of-sight very low pressure processes. U.S. Pat. No. 5,541,003 to Nagayama et al. describes a method for improving adhesion of a DLC film to substrates such as alloys containing Co, Ni or Fe, which have only a slight affinity for a DLC film, through the use of an intermediate layer consisting of an amorphous mixture of silicon and carbon, formed by a biased PECVD or ionization evaporation technique. This technique, while an improvement over prior approaches, has limitations (e.g., the process is limited to thin films (described for 3 microns DLC), while corrosion or abrasion or erosion resistant films require much thicker layers). For corrosion resistance, thick films are required to prevent any penetration or diffusion of corrosive material through the coating to the substrate. For erosion or abrasion, a thick film is required particularly on a soft substrate (e.g. carbon steel), due to the transfer of energy to the substrate from the impact of a hard particle (e.g. ~10 GPa quartz) on the surface. This can cause deformation of the soft substrate and fracture of the hard DLC coating. If the coating is thicker then the diameter of the particle, this energy transfer is greatly diminished, preventing fracture of the coating. Still a further limitation is that this technique cannot be applied to interior surfaces of a pipe or other hollow body. While prior approaches operate well in many applications for coating a workpiece, further advances are sought.

SUMMARY OF THE INVENTION

An objective of this invention is to provide a method of improving adhesion between a substrate and a hard coating (e.g., DLC) so that thick corrosion and erosion resistant coatings can be deposited with desired results even on soft substrates. A further objective is to provide an improved adhesion method that can be applied to the interior surfaces of hollow objects with a high deposition rate, so that these thick coatings can be economically produced. A further objective is to increase the bonding volume and mixing of substrate and adhesion layer so as to further increase the adhesion strength.

In accordance with the invention, Plasma Enhanced Bonding (PEB) is employed during a coating process to improve both adhesion and corrosion resistance. PEB may be used to form new ipterfacial compounds which offer the increased resistance to corrosion, as well as enhanced bonding to the workpiece being coated and any subsequently formed layer, such as an outer coating of diamond-like carbon. For example, formation of nickel silicide at a nickel/silicon interface or nickel germanicide at a nickel/germanium interface can be more etch resistant than an amorphous Si:H film deposited on a nickel workpiece.

The new interfacial compounds are comprised of the constituents of the substrate in combination with the constituents of a thin deposited layer, such as a layer having a thickness in the range of 0.2 nm to 70 nm, with the more preferred range being 0.2 to 20 nm and the most preferred range being 5 to 20 nm. These constituents are combined using plasma exposure with sufficiently high energy flux (voltage and power) to provide the activation energy for the thin deposited layer to react, thereby bonding with the substrate. For example, if workpiece "A" is comprised of constituents A1, A2, . . . An, and the thin deposited "B" layer is comprised of B1, B2, . . . Bn, then the interfacial compound can be formed by the combination of A1, A2, . . . An and B1, B2, . . . Bn. As one instance:

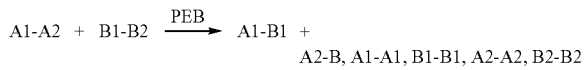

The available combinations are according to the tendency for inter-diffusion and bonding under PEB conditions. As another factor in determining the constituents of the "B" layer, species from the gas phase may diffuse into the thin "B" layer.

In one embodiment of the invention, the PEB processing is used to coat at least one interior surface of a workpiece, such as a pipe. Firstly, the desired conditions for layer deposition are established within the workpiece. These conditions may involve a pre-cleaning, vacuum conditions, temperature and electrical connections. When the workpiece is formed of a conductive material, the workpiece may be connected to function as a cathode.

A film is then deposited as the first of a number of films that define the interfacial compound of the thin layer. As one possibility, a germanium film is deposited. Other possible films include silicon, carbon and tin, although this list is not exhaustive. The selection of film material is at least partially based upon the surface on which the film is to be formed. The processing has been tested with workpieces formed of carbon steel, chrome carbon steel, silicon carbide, nickel-coated carbon steel, and nickel-coated stainless steel.

The PEB processing is implemented by exposing the thin deposited film (0.2 nm to 70 nm) to high energy plasma. The preferred plasma is an argon plasma. The film is exposed to high energy bursts from the plasma, such as 10 kW bursts provided by a pulsed DC discharge arrangement. In some applications, this approach may reach the material of the workpiece, rather than being limited to affecting the deposited films. A high energy argon plasma simultaneously provides energy for new bond formation and provides a limited degree of etch back. In a preferred embodiment, these high energy bursts involve lower voltage (<2000 V) and higher current compared to conventional methods, such as ion implantation in which high voltage is required to drive the ion substantially below the surface of the workpiece. Additionally, these conventional methods must operate at low pressures (<5 mTorr) so that the plasma sheath is collisionless. A disadvantage of low pressure operation is a decrease in deposition rate and the process becomes line-of-sight, so that complex shapes cannot be coated uniformly. A disadvantage of high voltage operation for hollow structures is that the plasma sheath expands with voltage and this will shut-off the plasma as the sheath approaches half the diameter. Arcing is an additional complication of high voltage operation. This invention allows both low voltage and high deposition rate, higher pressure operation. In embodiments of the invention, these two steps of depositing the film and exposing the film to high energy etch-back plasma are then repeated. Preferably, the cycle of depositing a film and then providing bombardment of the film using an argon plasma is repeated five to fifty times. Within each of these cycles, the deposition step is much shorter than the bombardment step. For example, the deposition of a particular germanium film may occur within five seconds, while the argon bombardment that follows is executed as thousands of high energy bursts over a ten-minute time period.

By repeating PEB for five to fifty times, the different deposited films are blended into the interfacial workpiece region with an increased number of participating bonds. Moreover, the bonding interface is increased in thickness, thus reducing stress concentration. Additionally a blended structure can be created with additional dangling bonds created and available for bonding during the intense argon bombardment, which then bond strongly with the next deposition layer, with substrate constituents gradually reduced in concentration and adhesion constituents gradually increased as the layers are increased, thus reducing any stress due to mismatch of mechanical properties between the layers. PEB can be used for many additional material combinations. The PEB process can be monitored using the voltage/current and waveform characteristics available via a conventional plasma power supply. The PEB process can result in a more stable plasma with reduced arcing and lower impedance, particularly in the case of strongly bonded substrate material such as silicon carbide.

As a result of the processing, a nickel silicide or a nickel germanicide may be formed on a nickel surface of a workpiece. On the other hand, iron silicide or iron germanicide may be formed on a carbon steel substrate.

The thin deposited layer is selected for its properties with regard to adhesion and corrosion resistance. Then, an outermost layer may be formed for other purposes. For example, a diamond-like carbon (DLC) may be deposited in order to meet hardness and surface roughness requirements. Optionally, the thin deposited layer is separated from the outermost layer (e.g., DLC) by one or more blend layers.

In addition to being used as an under layer, Ge and GeC are well suited for use as a cap layer for a DLC coating. As an under layer, Ge and GeC reduce the likelihood of chemical undercut on rough metal substrates, where the under layer may also contain silicon, particularly when the silicon is deposited from silane or tetramethylsilane. Using Ge, GeC, or Ge-doped DLC as the top layer prevents chemical penetration from above. Using Ge or GeC blended with hydrocarbon improves chemical resistance of DLC coatings. Additionally, Ge or GeC reduces the porosity of a DLC coating. Ge or GeC reduces stress of the DLC coating and may be used to increase the thickness of the DLC coating. Precursors containing Ge and GeC improve the composition and material property uniformity along the length of the workpiece, such as a pipe.

DETAILED DESCRIPTION

Figure 1:
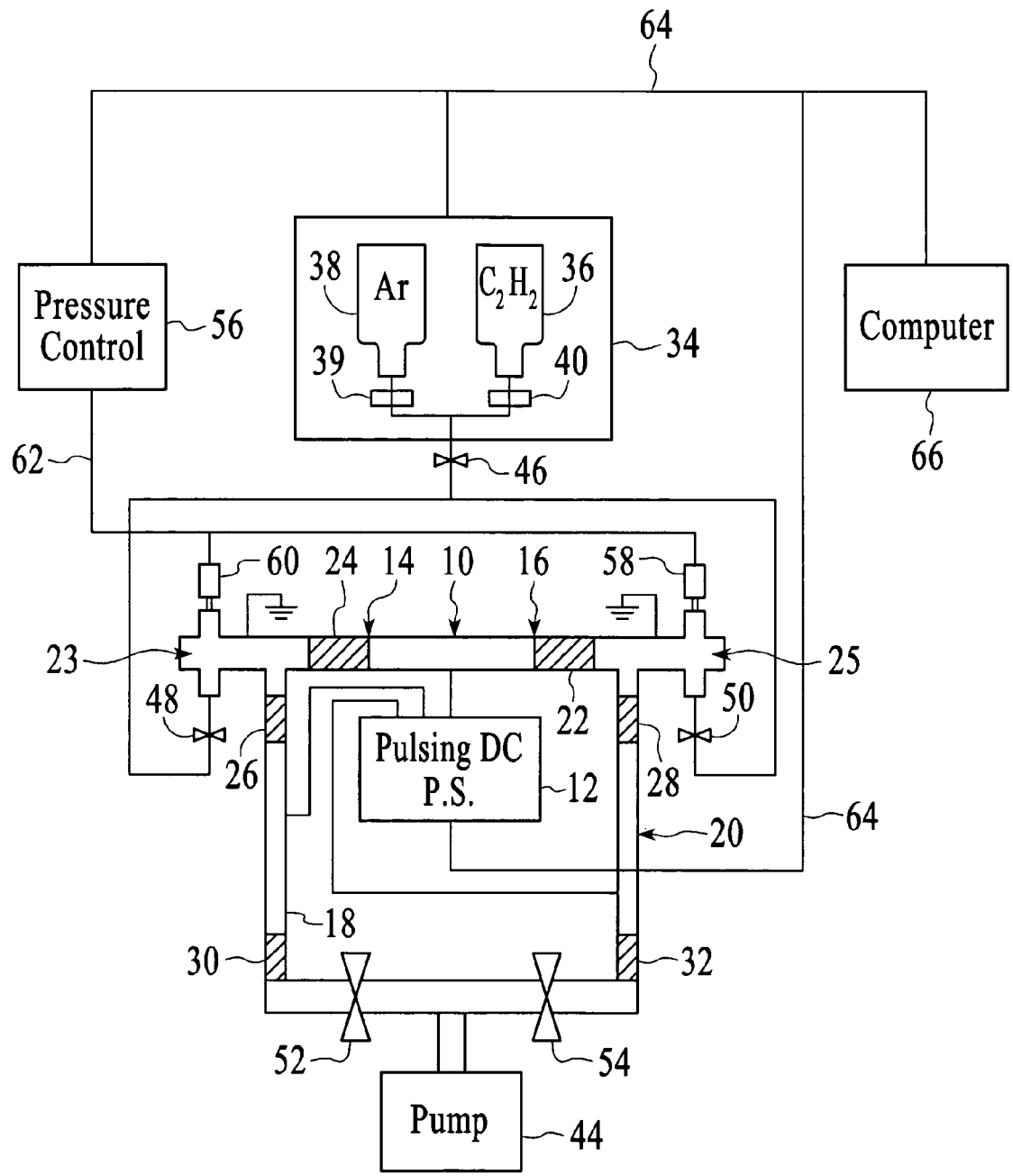
FIG. 1 is a functional view of a coating apparatus in accordance with one embodiment of the invention.

With reference to FIG. 1, a conductive pipe or "workpiece" 10 is connected to a pulsed DC power supply 12, which applies a pulsed negative bias. This negative bias is used to (a) create a plasma between a cathode and an anode, (b) draw an ionized reactive gas to the surfaces to be coated, (c) allow ion bombardment during PEB processing to improve coating properties such as adhesion and corrosion resistance, and (d) allow control of uniformity by adjusting the duty cycle so as to permit replenishment of a source gas and depletion of surface charges resulting from the coating process during the "off" portion of the cycle. Here, the workpiece 10 functions as a cathode while anodes 18 and 20 are connected to the positive side of the pulsed DC supply. Gas reservoirs 23 and 25 are coupled to each end of the workpiece. Only two gas reservoirs are shown, but more may be involved in the PEB and subsequent coating steps that will be described below. Alternatively, the anodes 18 and 20 can be inserted inside the gas reservoirs and configured with inert gas purging to prevent coating of the anode in cases where the coating is an insulator, since this coating of the anodes would cause the anodes to "disappear" electrically.

Pressure sensors 58 and 60 are located at each gas reservoir 23 and 25, so that the pressure drop across the pipe 10 can be monitored and controlled. The anodes 18 and 20 are located near workpiece openings 14 and 16 and are physically and electrically isolated from the conductive workpiece and other functional subsystems by insulators 22, 24, 26, 28, 30 and 32. A gas supply subsystem 34 and pumping subsystem 44 are coupled to the gas reservoirs and the workpiece openings 14 and 16 via flow control valves 46, 48, 50, 52 and 54.

In FIG. 1, the workpiece 10 is shown as a single piece, but may be an assembly of tubes or pieces. The assembly preferably has all welding and assembly steps completed and should be leak tested prior to the coating process to be described below. The workpiece may be conductive piping that is connected to a system that includes the gas supply subsystem 34 and the pumping subsystem 44. A readily available non-toxic carbon containing gas, such as methane or acetylene, is provided by a first gas supply container 36. This gas is used to form a diamond-like carbon (DLC) coating on the inside of the workpiece. Argon (or other sputter gas) is provided from a second gas supply container 38 to allow plasma "pre-cleaning" of the pipe surface, and mixing of Ar and carbon-containing gas. The gas supply containers are also capable of providing a suitable material for forming an interfacial compound during PEB processing. This interfacial compound provides the improvements in adhesion and corrosion resistance. While not exhaustive, a list of suitable materials include Ge, Si, C and potentially Sn.

A pressure controller 56 receives information from an optical probe 58 and a langmuir probe 60, which are placed such that the optical probe has a line-of-sight into the plasma and the langmuir probe contacts the plasma. The two probes sense plasma intensity and generate information indicative of the intensity level. This information is used by the controller to determine a proper setting for flow control valves 52 and 54. The setting may be such that the pressure inside the workpiece 10 establishes a condition in which the electron mean free path is related to the inner diameter of the workpiece, such that high energy electrons will oscillate between the cathode walls and increase ionizing collisions by the "hollow cathode" effect. Thus, a more intense plasma is generated within the workpiece. Since the electron mean free path increases as the pressure decreases, it is necessary to decrease pressure as the pipe diameter increases. For example, a one inch (25 millimeter) diameter gasline will generate a hollow cathode plasma at a pressure of approximately 200 mTorr, while a four inch (101.6 millimeter) diameter pump exhaust duct would generate a plasma at a pressure of approximately 50 mTorr. These are intended to be approximate values to show the general trend of lower pressure with larger diameter, but the pressure range can vary significantly from these values and still maintain a hollow cathode plasma. The "hollow cathode effect" as used herein occurs when at least two cathode surfaces are positioned opposite to each other and are electrically cooperative with remote anodes, such that a large increase in current is achieved as compared to a conventional plasma glow. The increase is due to the "oscillation motion" of fast (hot, accelerated) electrons between the opposite space charge sheaths, which enhances the excitation and ionization rates in the plasma several orders higher than in the conventional glow discharge. Because this electron pendulum motion is related to the mean free path of the fast electrons, there is a relationship of the hollow cathode effect to pressure inside the hollow cathode and the spacing between the cathodes. That is, a hollow cathode with a smaller spacing will operate at a higher pressure than a hollow cathode with a larger spacing.

The pressure controller 56 is also used to monitor the pressure drop across the pipe and control and adjust it using pump throttle valves 52 and 54 or rapid response mass flow control valves 48 and 50. It is desirable to prevent too large a drop in pressure and flow velocity for small diameter (3.8 cm) and long (61 cm) pipes to ensure a uniform high density hollow cathode effect plasma down the length of the pipe during the "on" condition of the pulsed DC supply. On the other hand, during the "off" cycle of a DC pulsed plasma burst, when it is desirable to rapidly refill the pipe with reactant gas, the pressure drop and flow velocity can be increased.

It may also be desirable to change the duty cycle in different bursts. For example, a deposition burst is run at 100 kHz with a duty cycle of 55% "on," that is 4.5 microseconds "off" and 5.5 microseconds "on." A time period of 4.5 microseconds is not long enough to replenish the reactant gas throughout the length of a small diameter and long pipe, so this deposition burst should be run for a time period of approximately 10 microseconds. This is followed by a longer lower frequency burst, which shuts the high frequency DC pulsing off completely during the "off" duty cycle to allow the gas to be replenished through the pipe. For example, a 25 Hz burst with a 10% duty cycle will turn the high frequency pulsing on for 4 msec and shut it off for 36 msec. This "off" cycle should be increased as the diameter becomes smaller and the length longer, with approximately 30 milliseconds being applicable for a 3.8 cm diameter and 91 cm long pipe at 80 mTorr and 160 sccm of gas flow.

The degree of ionization or plasma intensity is important for the deposition technique to be effective, since it is only the ionized gas that is accelerated across the plasma sheath into the workpiece 10. The hollow cathode effect provides a more intense plasma than is otherwise available in DC or RF plasmas. This increase in intensity is available without the complications of other means of generating intense plasmas, such as magnets or microwave plasma sources. The optical and langmuir probes 58 and 60 are located at the anode end connections to monitor when the intense hollow cathode is properly generated.

Computer software control 66 is shown as being connected to the gas supply subsystem 34 and the pressure controller 56. In addition, the computer software control is able to generate and transmit control signals via an interface cable 64 to the DC pulsed power supply subsystem 12 for the purpose of governing operations.

When considering the flow rates and pressures required through a workpiece with a high aspect ratio (length/diameter), if the internal section is approximated to be a long circular tube with laminar flow, Poiseuille's equation can be used:

$$V = \frac{\pi r^4 \Delta P}{8\eta l}$$

where V is the volumetric flow rate, r is the passageway radius, ΔP is the average pressure, l is the passageway length, η is the viscosity. In the equation, r is raised to the fourth power and will cause a significant decrease in V. For example, a 3.8 cm diameter tube, having the same length as a 7.6 cm diameter tube, will have 16× less flow, all other factors being equal. ΔP=VR, where R is the resistance to flow, $$R = \frac{8\eta l}{\pi r^4}.$$

The pressure gradient ΔP must increase as R becomes larger to maintain the same flow.

For small diameter pipes, the plasma "off" time can be increased to refill the pipe or the pressure gradient can be increased to decrease the residence time, keeping in mind the negative effect too large a pressure gradient has on plasma uniformity. A combination of increased plasma "off" time and increased pressure gradient may also be implemented, being careful not to negatively affect the plasma uniformity with too large a pressure gradient.

The decrease in V and increase in pressure gradient with increasing aspect ratio (length/diameter) will have a significant effect on the uniformity of the deposition down the length of the workpiece. Since deposition rate is proportional to pressure and because the pressure becomes higher at the entrance of the workpiece with respect to the exit, the uniformity will become progressively worse with increasing length/diameter. Thus, it is desirable to have a low pressure drop ΔP across the pipe for good coating uniformity. On the other hand, if ΔP and thus the flow rate V become too low, the reactant gas will tend to deplete before it reaches the exit end of the pipe.

Figure 2:
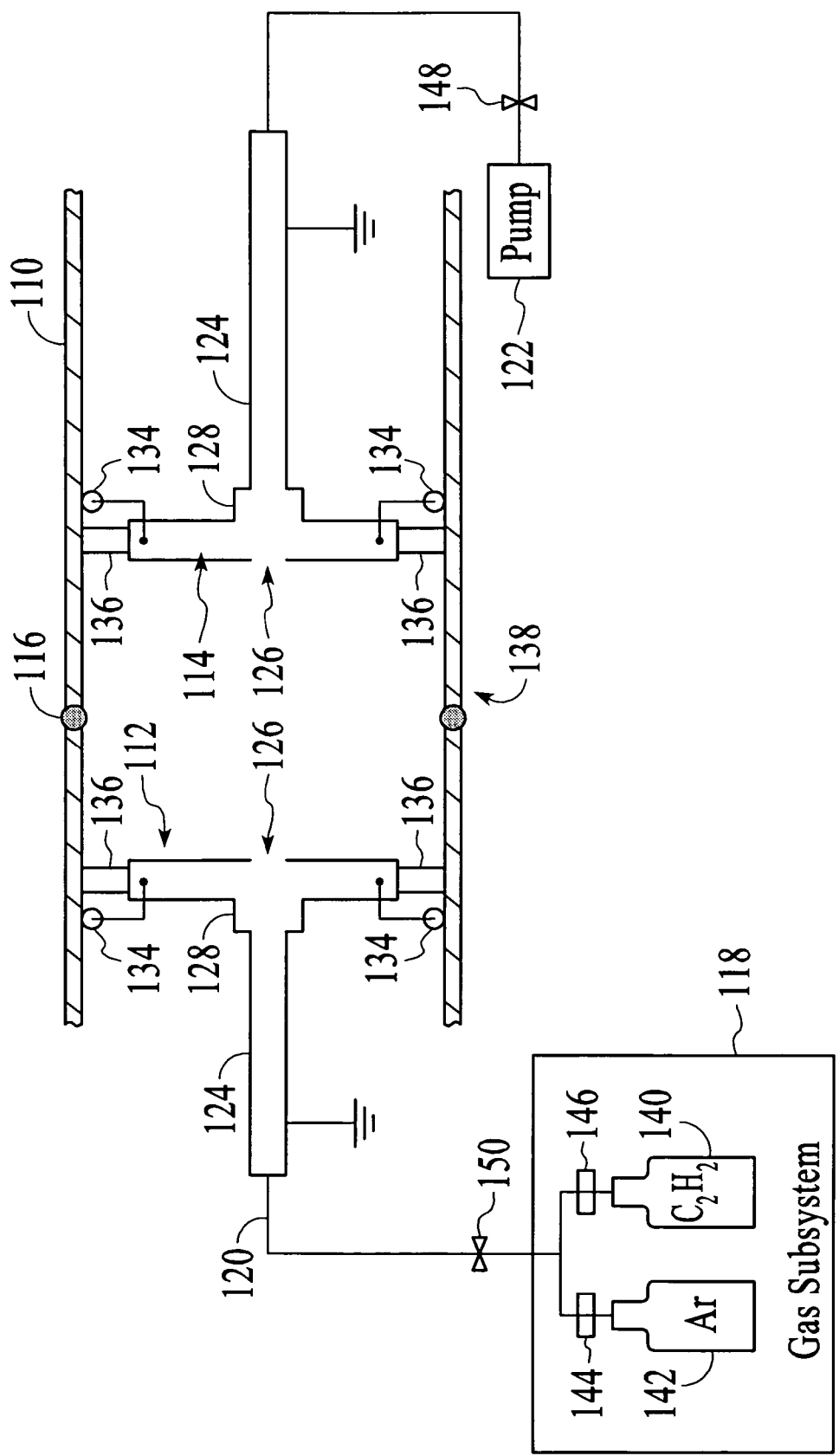
FIG. 2 is a functional view of a second embodiment of a coating apparatus in accordance with the invention.

FIG. 2 shows another possible arrangement. Here, the application of the invention is performed "in the field." A conductive workpiece 110 may be very long in length, for example having a length-to-diameter ratio greater than 50:1. The conductive workpiece may be an assembly of sections welded together to form long lengths of pipe, but may also be a single high aspect ratio piece. Often, sections of pipe, having already been coated and having a uniform coating, are welded together. The welds and the areas surrounding the welds, in which the welding process has compromised the coating, require corrosion-resistant coating.

Conductive structures 112 and 114 are inserted into workpiece openings (not shown) and maneuvered into position at or near weld 116. The conductive structure 112 is coupled to a gas supply subsystem 118 via flexible gas supply line 120. The conductive structure 114 is coupled to a pumping subsystem 122 via flexible pump lines 124. The gas supply and pump lines are connected to openings 126 (FIG. 3) by vacuum-tight fittings 128 by a means known in the art. The gas supply and pump lines are electrically isolated from the conductive structure by an insulator 130, also shown in FIG. 3. A readily available non-toxic carbon-containing gas, such as methane or acetylene, is provided by a first gas supply container 140. This gas is used to form a diamond-like carbon (DLC) coating on the inside of the workpiece 110. Argon (or other sputter gas) is provided from a second gas container 142 to allow a plasma "pre-cleaning" of the pipe surfaces and to allow the PEB processing for forming the interfacial compound that promotes adhesion and corrosion resistance. While not shown, supplies of other gases (e.g., Ge) are available as needed for the deposition of films.

Figure 3:
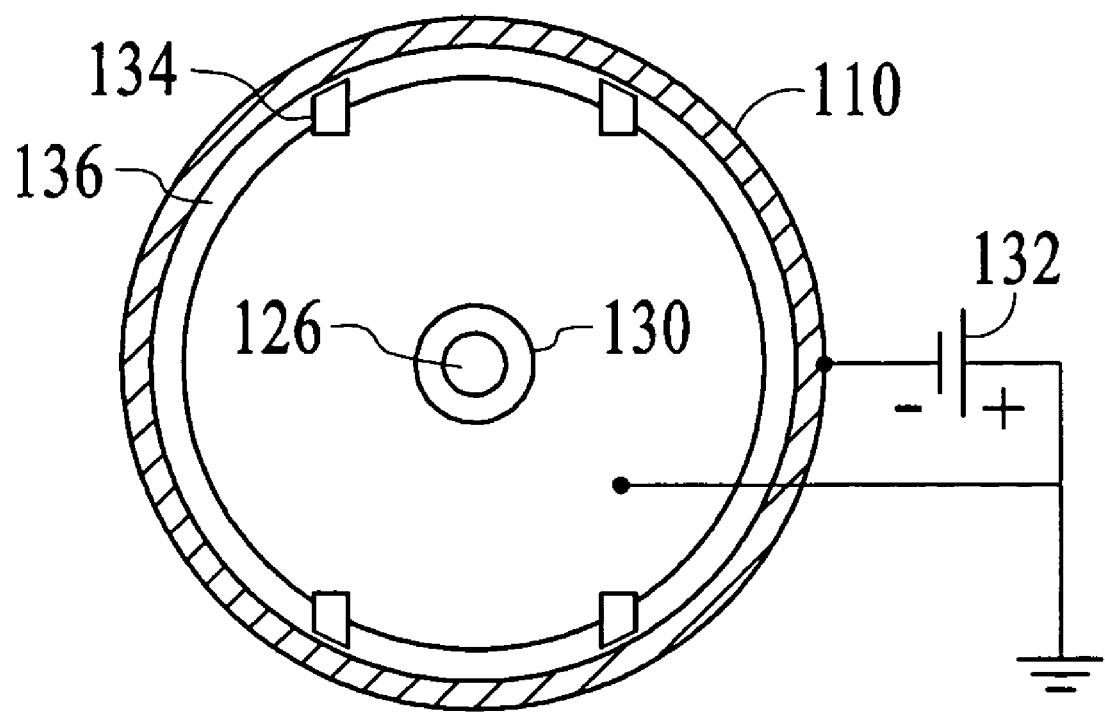
FIG. 3 shows an end view of the workpiece in accordance with the second embodiment of the invention.

The conductive pipe or "workpiece" 110 is connected to a pulsed DC power supply 132, which applies a pulsed negative bias. Here, the workpiece 110 functions as a cathode, while the conductive structures 112 and 114 are connected to the positive side of the pulsed DC supply and biased as anodes. The conductive structures are mounted on insulated rollers 134. A retractable vacuum seal 136, as shown in FIG. 3, surrounds the conductive structures. The vacuum seal, when extended, electrically isolates the conductive structures (anodes) from the pipe and physically isolates a section 138 of pipe to be coated from the remainder of the pipe.

When the vacuum seal 136 is extended, a localized section 138 of the workpiece 110 is isolated from the remainder of the workpiece. The section is pumped to a low pressure by the pumping subsystem 122 and the DC pulsed power supply 132 is used to apply a negative bias to the pipe 110 such that it functions as a cathode. Even though the entire pipe 110 is biased as a cathode, a plasma will only be generated within the interior of the pipe (workpiece section 138) that resides between the conductive structures 112 and 114, because this is the only portion of the pipe interior that is at a low pressure and meets the spacing and pressure requirements for plasma ignition. Also, this section of pipe is the only area exposed to the reactant gases. Therefore, only the internal surfaces of the pipe section will be coated.

As shown in FIG. 2, a precursor gas is introduced through the opening 126 in the conductive structure 112 when the gas inlet valve 150 is opened. Mass flow controllers 144 and 146 control the amount of gas flowing into the workpiece section 138. This gas is ionized into a plasma by the applied voltage. Ions contained in the gas are pulled to the internal surfaces of the workpiece section 138 (cathode) to form a coating. Unused gas and by-products are exhausted away by the pump 122 through an opening 126 in the conductive structure 114. The flow rate of gas out of the workpiece section 138 is controlled by pump throttle valve 148, such that the amount of gas and pressure within the workpiece section can be independently controlled to further optimize the uniformity of the coating.

In the case of a plasma-activated coating, process and in particular when a hollow cathode plasma is generated, the plasma density depends on the pressure/diameter ratio. A typical prior art plasma density is a maximum of approximately 1E10 ions/cm$^3$ or about 10% ionization (ionized gas/total gas particles×100). By using a hollow cathode plasma, this technique can achieve plasma densities of up to 1E12 ions/cm$^3$. This provides many advantages, including higher deposition rate, improved film quality, and a thin plasma sheath, such that ion energy is not lost due to collisions across the sheath.

If a Child's law plasma sheath, s, is assumed for a planar diode structure, then: s=0.4714×$L_{De}$(2V/$T_e$), where $L_{De}$=$\epsilon_0 T_e$/en$_i$) is the Debye length, n$_i$ is the electron and ion density, $T_e$ is the electron temperature in electron volts, $\epsilon_0$ is the permittivity of free space, e is the charge of an electron or 1.6E-19C, and V is the bias voltage. For a typical plasma density of 1E10 ions/cm$^3$ and $T_e$=3 eV, with an applied bias of 1000V, s (standard density)=0.8 cm. Given the same parameters and a hollow cathode plasma density of 1E12 ions/cm$^3$, s (hollow cathode)=0.08 cm. The mean free path, λ, of N$_2$ at typical PECVD pressure of 100 mTorr is approximately 0.5 cm, so that for a standard density plasma (where λ<s), ions will collide within the sheath and not arrive at the substrate with the full plasma energy, i.e., at approximately the applied bias voltage. But with a hollow cathode plasma, the sheath has fewer collisions. Thus, the hollow cathode technique provides significant advantages for the PECVD process where accurate control of ion energy is required, such as DLC. Control of the pressure is also advantageous throughout the workpiece for these types of processes, due to the effect of pressure on plasma density.

Figure 4:
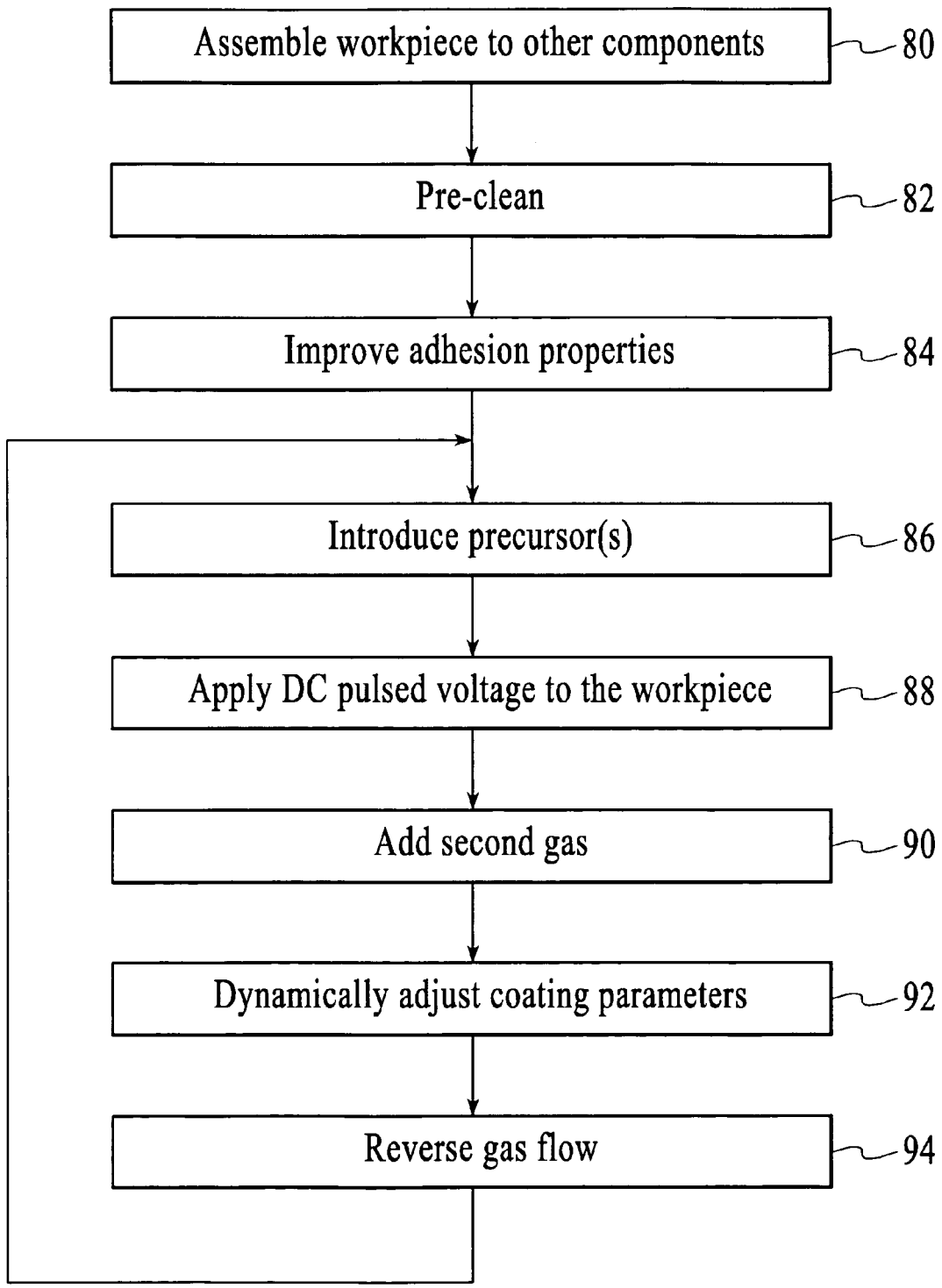
FIG. 4 shows a process flow of steps for implementing the invention.

One embodiment of the process flow in accordance with the invention will be described with reference to FIGS. 2 and 4, but the process is equally applicable to the arrangement of FIG. 1. At step 80, the workpiece 110 is assembled to other components of a tubing system, so that it is not necessary to heat the workpiece following the completion of the interior coating process. Thus, all welding steps involving the workpiece are completed to apply a coating to the interior of the workpiece section 138. As previously noted, the workpiece is shown as an assembly of tubes or parts, but may be a unitary section (as shown in FIG. 1).

At step 82, the conductive structures 112 and 114 are positioned at the first welded section. A pre-cleaning may be an introduction of a sputtering gas, such as argon, from the second gas supply container 142. The pre-cleaning may be initiated after pump down to $1 \times 10^{-3}$ Torr or, preferentially, below $1 \times 10$ Torr. Contaminants on the interior surface of the workpiece are sputtered off when a negative DC pulse is applied via the power supply 132. This pre-cleaning is not critical, but may be advantageous.

At step 84, PEB is performed in order to increase the adhesion properties and, simultaneously, to increase resistance to corrosion. In a preferred embodiment, germanium is the material of primary interest, but other materials are also suitable, including silicon, carbon and tin. The selection of film material is at least partially based upon the surface on which the film is to be formed. By using PEB, an interfacial compound is formed to provide the target properties. For example, formation of nickel silicide at a nickel/silicon interface or nickel germanicide at a nickel/germanium interface may be formed on a nickel workpiece.

Figure 5:
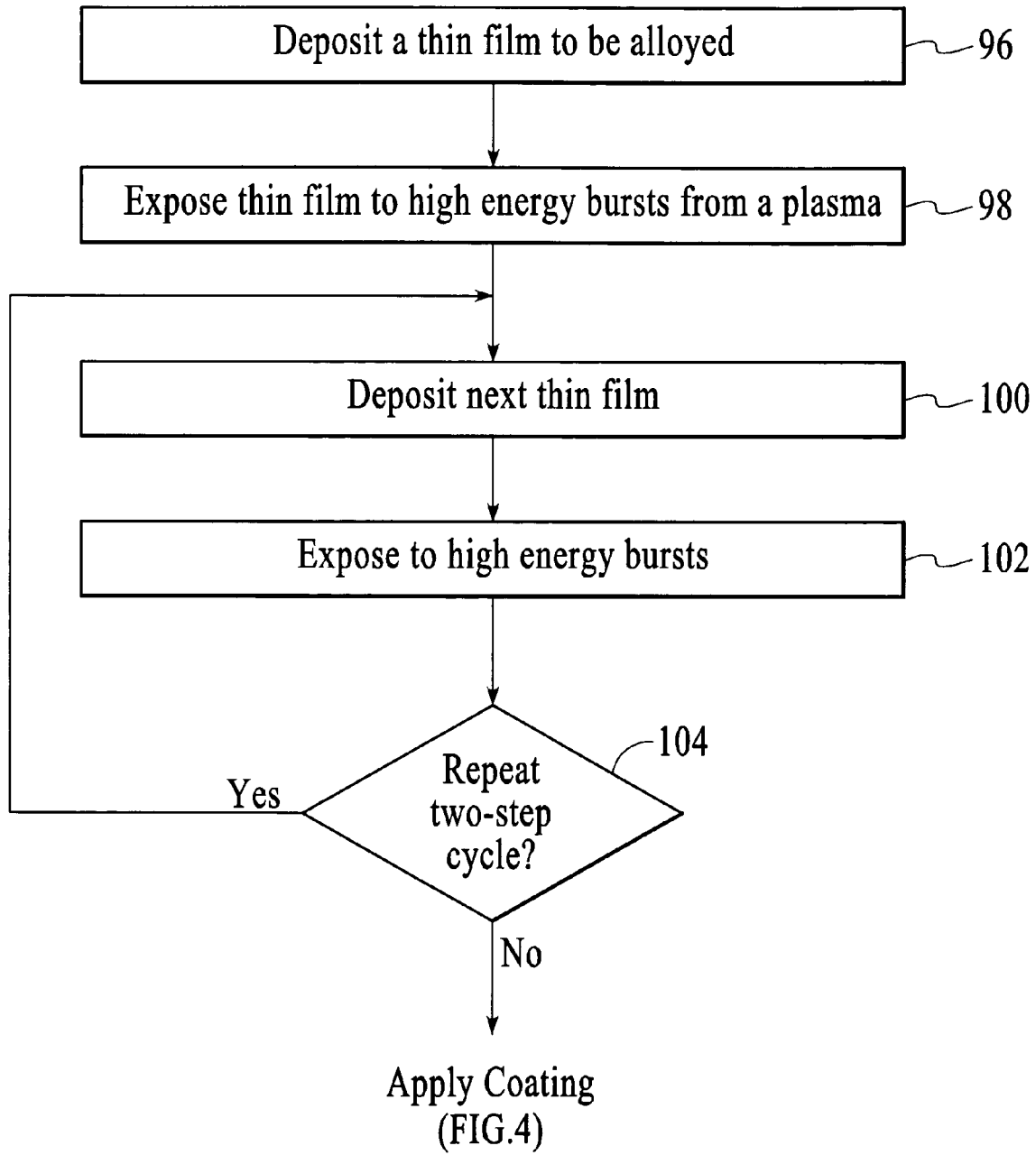
FIG. 5 shows a process flow of substeps for implementing step 84 of FIG. 4.

One embodiment of the step 84 is represented in a series of substeps in FIG. 5. A thin film is deposited in substep 96. The thickness of the film may be in the range of 0.2 nm to 70 nm. Then, in substep 98, the thin film is exposed to high energy bursts from a plasma. The preferred plasma is an argon plasma, but this is not critical. The film is exposed to high energy bursts from the plasma, such as 10 kW bursts provided by a pulsed DC discharge arrangement. Particularly in this first execution of the deposit-and expose cycle, the alloying may reach the material of the workpiece, rather than being limited to affecting the deposited film. The high energy argon plasma simultaneously provides energy for new bond formation and provides a limited degree of etch back.

The resulting interfacial compound is comprised of the constituents of the workpiece 110 in combination with the constituents of the thin deposited layer. These constituents are combined using plasma exposure with sufficiently high energy flux (voltage and power) to provide the activation energy for the thin deposited layer to react, thereby bonding with the substrate. For example, if workpiece "A" is comprised of constituents A1, A2, . . . An, and the thin deposited "B" layer is comprised of B1, B2, . . . Bn, then the interfacial compound can be formed by the combination of A1, A2, . . . An and B1, B2, . . . Bn. As one instance:

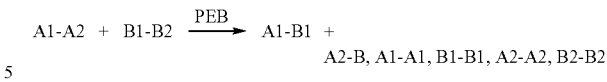

The available combinations will depend upon the tendency for inter-diffusion and bonding under PEB conditions. As another factor in determining the constituents of the reacted "B" layer, species from the gas phase may diffuse into the thin "B" layer. As examples, hydrogen may be intentionally introduced and oxygen may be intentionally or unintentionally introduced during formation of the compound.

Substeps 100 and 102 repeat the cycle of depositing a thin film and exposing the deposited film to high energy bursts. Although some etch back will occur, the repeat of the cycle will add to the total thickness. That is, the deposition of material at substep 100 exceeds the etch back that occurs at substep 102.

Decision substep 104 is a determination of whether additional material (e.g., Ge) is to be added. If affirmative, the cycle is repeated. Preferably, the cycle of depositing a film and then providing bombardment of the film using an argon plasma is repeated five to fifty times. Within each of these cycles, the deposition is much shorter than the bombardment substep. For example, the deposition of a particular germanium film at substep 100 may occur within five seconds, while the argon bombardment that follows (substep 102) is executed as thousands of high energy bursts over a ten-minute time period. By repeating PEB for five to fifty times, the different deposited films are blended into the interfacial workpiece region with an increased number of participating bonds. Moreover, the bonding interface is increased in thickness, thus reducing stress concentration. PEB can be used for many additional material combinations. The PEB process can be monitored using the voltage/current and waveform characteristics available via a conventional plasma power supply.

Figure 6:
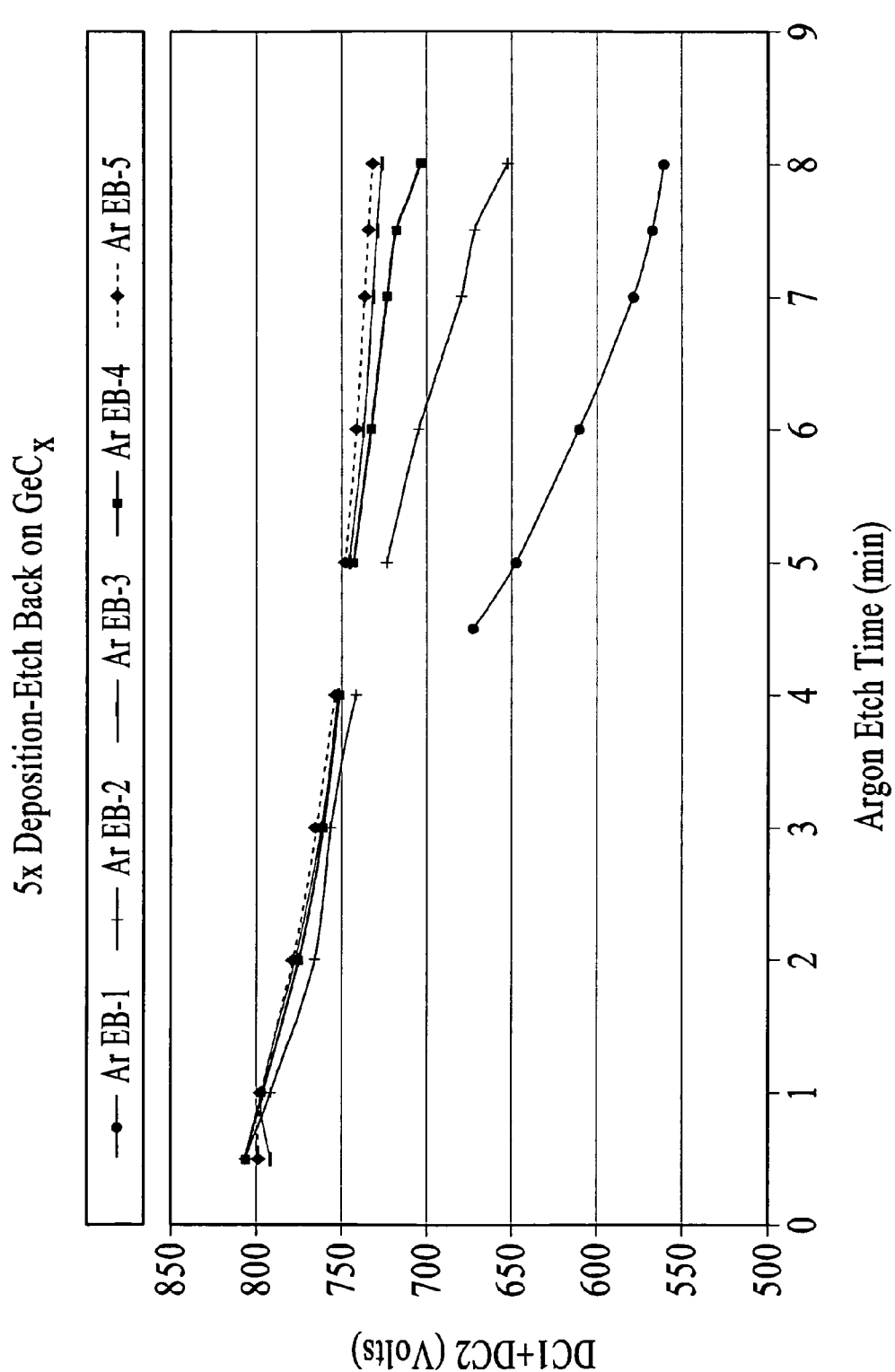
FIG. 6 is a graph of test results from using GeC as an interfacial layer.

When a negative response occurs at decision substep 104, formation of the interfacial layer is complete. FIG. 6 is a graph of test results of the substeps of FIG. 5 in which the deposition substeps 96 and 100 employed $Ge(CH_3)_4$ as the gas, while the etch back substeps 98 and 102 utilized argon gas. Deposition occurred over a period of five seconds, with a six second stabilization. In comparison, the etch back occurred over an eight-minute time period.

In accordance with FIG. 6, the interfacial layer is formed by first introducing germanium so as to promote adhesion to the workpiece. In the experimentation, the workpiece was a six-inch stainless steel (316) substrate that was nickel plated to a thickness of between 1 micron and 1.5 microns. Then, a silicon source was connected with the germanium source. Possible precursors include $SiH_4$ and $Si(CH_3)_4$ for the silicon source and $GeH_4$ and $Ge(CH_3)_4$ for the germanium source. The preferred source is tetramethylgermanium.

Optionally, the formation of the interfacial layer may be followed by formation of one or more blend layers. For example, $C_2H_2$ may be introduced at a low level as compared to a silicon source and a germanium source. In a preferred embodiment, a sequence of blend layers is provided with increasing $C_2H_2$ and decreasing silicon concentrations.

Then, the final layer may be formed. Returning to FIGS. 2 and 4, at least one precursor may be introduced into the workpiece section 138 at step 86. By way of example, but not limitation, precursors include methane, acetylene or toluene, or other similar hydrocarbons. The application of a DC pulsed voltage is represented by step 88 in FIG. 4. During the coating step, argon may be mixed with the carbon-containing precursors, as indicated at step 90.

In step 92, the coating parameters are dynamically adjusted during the coating process. Probes provide information that can be used by the computer software control 162 and the pressure controller 160 to maintain various parameters within their ranges of tolerance. Thus, the factors that determine pressure within the workpiece section 138 can be adjusted as needed or the magnitude and duty cycle of the pulsed bias may be adjusted, if necessary.

Upon completion of the first duty cycle, reverse flow cycling is implemented in step 94, but this step is not required. Process flow steps 80-94 may be repeated to ensure that the internal surfaces of the workpiece sections 138 of different diameters and lengths are coated uniformly. After the completion of the coating process, the conductive structures are repositioned at the next section.

In principle, any metal, ceramic or DLC coating can be applied in a laboratory that has the desired properties of hardness and corrosion resistance (e.g., TiN, CrN, etc). However, for coatings applied in the field, preferably a non-toxic or low toxicity precursor is employed. A DLC precursor such as methane, acetylene or toluene is used as the source gas in the preferred embodiment. DLC has been shown to provide a hard, corrosion resistant, and low friction coating. Properties of this film can be tailored by adjusting the sp3 (diamond), sp2 (graphite) and sp1 (linear) bonding hybridization ratios in the film. Hydrogen content will also affect the film properties. Typically, the highest sp3 ratio (most diamond-like) is obtained by methane, but this also produces a lower deposition rate compared to higher carbon molecules and also higher compressive stress, limiting film thickness to 5000 Å. Acetylene can also provide high sp3 content with a higher deposition rate compared to methane but the bias voltage should be increased to compensate for the larger molecule size. Additives (e.g., silicon or silicon oxide) in the DLC matrix can improve thermal stability and can reduce compressive stress. An organic-based precursor, such as tetramethylsilane, $Si(CH_3)_4$, or hexemethyldisolxane, $C_6H_{18}Si_2O$, can be mixed with the hydrocarbon precursor(s) to introduce these dopants.

Film properties can thus be tailored by selection of the precursor gas, or layered films can be deposited. For example, if it is necessary for deposited films to cover a rough surface (e.g., welds) with a thick deposited coating, the above process can be modified by deposition of a thin methanebased layer, followed by the use of a higher deposition rate, lower stress precursors such as toluene, or by higher energy ion bombardment to increase adhesion and reduce stress. The trade-offs of desired mechanical, electrical or optical film properties and deposition rate and stress for given precursors and bonding hybridizations can be optimized for a given process.

The process can be varied for different applications. In the formation of the final layer (i.e., cap layer), pure DLC using a $C_2H_2$ source may be provided, but optionally germanium may be added. For the interfacial/adhesion layer, a higher germanium concentration may be used (including 100% germanium) if the workpiece is to be employed in extremely corrosive environments, such as for certain applications in the oil industry. On the other hand, for the best adhesion to stainless steel, a lower concentration of germanium compared to silicon should be used.

Figure 7:
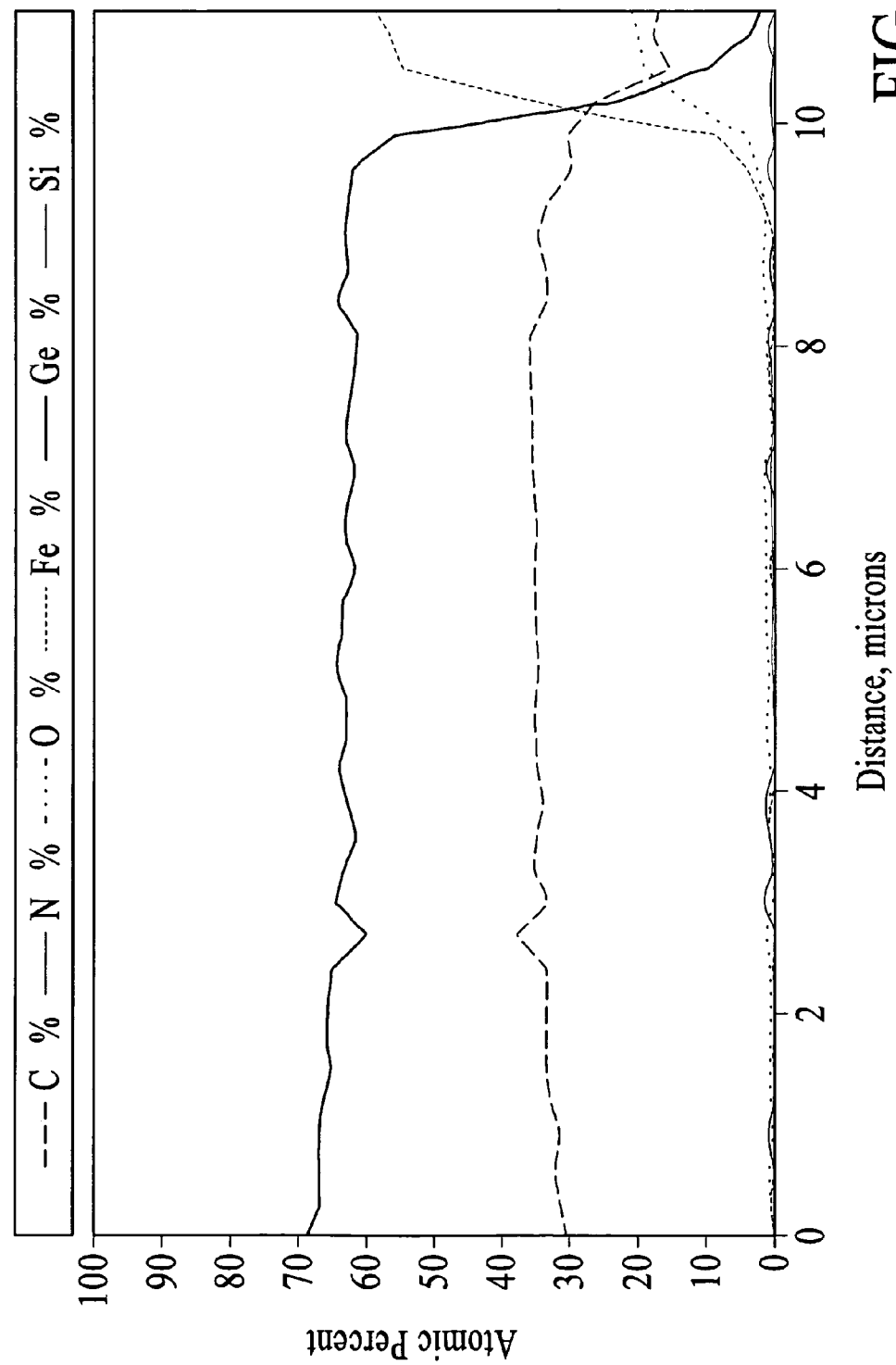
FIGS. 7 and 8 are Auger profiles of pipes, showing the differences in uses of silicon and germanium.
Figure 8:
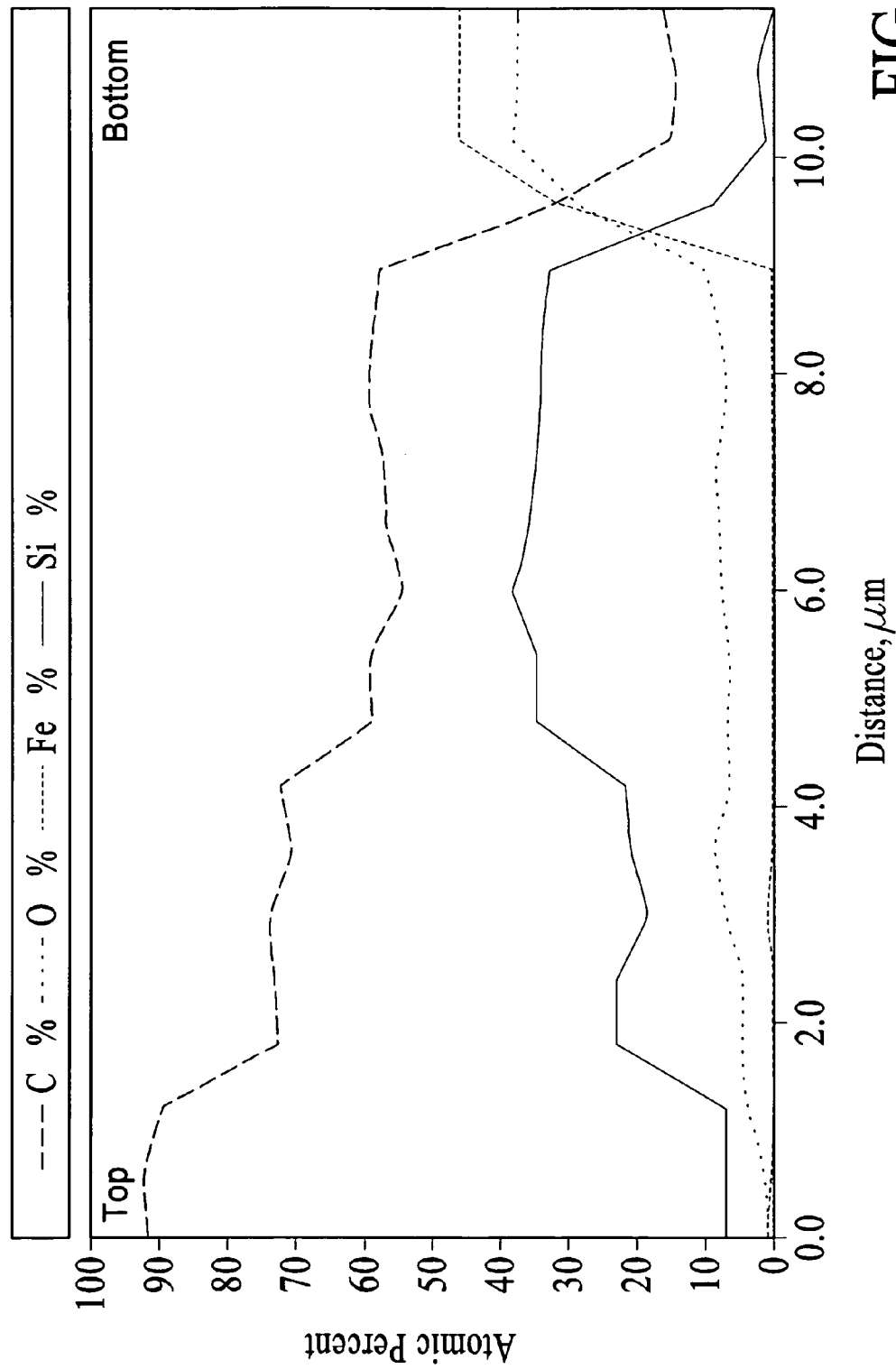

While other materials have been described as being suitable for implementing the present invention, it has been determined that Group IV compounds, by way of example and not by limitation, Ge and germanium carbide are employed for a preferred embodiment. These materials can prevent chemical undercut in the vicinity of defects on rough metal substrates, particularly where the under layer contains silicon or silicon is deposited from silane or tetramethylsilane. Ge and/or GeC may also be used to reduce porosity of the DLC coating. Additionally, Ge or GeC may be used as the cap layer atop the DLC coating. If a pure DLC cap is required for the low wear, low COF, and high hardness known for DLCs, then a high concentration Ge or GeC layer may be deposited just beneath the cap layer. That is, the materials may be used before the formation of the DLC coating, during the formation of the DLC coating, or following the formation of the DLC coating. Using Ge, GeC, or a Ge-doped DLC top layer reduces the susceptibility of the added coatings to chemical penetration from the top. Additionally, the materials improve the composition and material property uniformity along the length of a workpiece, such as a pipe. Table 1 shows the differences in coating material uniformity from the gas entry to the gas exit for uses of Si and Ge. Also, the ratio of germanium/carbon incorporated in the film is much higher for tetramethylgermanium compared to the ratio of silicon/carbon incorporated using tetramethylsilane (as can be seen by comparing the two Auger profiles of FIG. 7 (Ge) and FIG. 8 (Si)). Using a Ge or GeC precursor reduces the stress and increases the thickness of the DLC coating.

TABLE 1

| Sample Location | % C | % Si | % Ge | C/Si | C/Ge |
|---|---|---|---|---|---|
| Si Entry | 57.9 | 39.2 | 0 | 1.477041 | |
| Si Exit | 77 | 16.9 | 0 | 4.556213 | |
| Ge Entry | 35 | 0 | 63 | | 0.555556 |
| Ge Exit | 36 | 0 | 61 | | 0.590164 |

Data shows that the present invention significantly reduces susceptibility of chemical attack on exposure to HCl, NaCl, $H_2SO_4$, sour autoclave, or other corrosive environments. The reduction is most significant with regard to undercut attack, where undercutting is defined as cutting through a coating so as to expose adjacent layers or the substrate to attack.

EXAMPLE 1

For the case of coating the interior of a 1.75 inch (44.45 millimeter) diameter by 12 inch (304.8 millimeters) long carbon steel (1222) pipe, using a DC pulse power supply to generate the plasma as described above. It should be noted that the power settings below are DC values and the per pulse power will be much higher, resulting in high ion bombardment as described earlier.

A) The pipe is pumped to the low millitorr pressure range.

B) The surface is activated and cleaned by introducing argon gas, and generating a plasma by applying a DC pulsed bias voltage.

C) A nitrogen plasma is used to heat the part to the desired temperature.

D) Adhesion PEB steps:
   1. Tetramethylgermanium precursor is introduced with argon at a pressure of 150 mTorr and a power of 180 watts with a 5% total duty cycle for 5 seconds.
   2. Argon is introduced for 4 minutes at a pressure of 65 mTorr with a power of 240 watts with a duty cycle of 15%.
   3. Steps A and B are repeated five times.

E) Blend layer: 2% $SiH_4$ with balance argon, tetramethylgermanium and $C_2H_2$ were introduced with a pressure of 120 mTorr. $C_2H_2$ flow is gradually increased and $SiH_4$ flow and TMG flow are decreased through the step.
F) A DLC layer is deposited using $C_2H_2$ and Ar.
G) Tetramethylgermanium is introduced with argon for 2 minutes.
H) A final top layer DLC cap is deposited using the same conditions as step F.

The properties of this coating were: deposition rate=0.22 microns/min, hardness=14 GPa, thickness=40 microns, scratch adhesion force (Lc3)=29N, and the wear coefficient was 1.6 E-6 mm3/N-m using a 5 mm WC ball with a load of 5N under dry conditions. Corrosion resistance was tested by exposing coupons in an aggressive "sour autoclave" test typically used in the oil industry. The conditions for this test were:
Gas Phase: 85% CO2, 14% CH4, 1% H2S
Aqueous: DI H2O, Xylene
Temp: 194 F
Pressure: 1000 psig
Duration: 30 days
2 decompressions/recompressions The coating was intentionally punctured through to the substrate, prior to the test, to ensure no corrosive undercut of the coating, which could be caused by poor adhesion. The result of this test showed no undercut or lifting of the coating from the punctured area and also no corrosive attack on the coating from the surface. Prior to the development of this PEB adhesion process, layered DLC coatings of this thickness had exhibited poor adhesion on carbon steel and had failed sour autoclave test.

EXAMPLE 2

Deposition of a well bonded DLC layer to the interior of a 1.5 inch (38.1 millimeters) diameter by 6 inch (152.4 millimeters) long silicon carbide pipe. Good adhesion to a silicon carbide substrate is difficult to achieve, due to the strongly bonded ceramic structure of the substrate and thus the lack of dangling bonds available for bonding with the adhesion layer at the interface. An additional problem is the more insulating nature of the ceramic structure which resulted in high voltages, and severe arcing, when a conventional $SiH_4$ deposited adhesion layer was used. In contrast with the PEB adhesion process the plasma ran at ~20% lower voltage and 30% higher current with no arcing. Again, a DC pulse power source is used to generate the plasma.
A) The pipe is pumped to the low millitorr pressure range.
B) A nitrogen plasma is used to prepare the surface and to heat the part to the desired temperature.
C) Adhesion PEB steps:
  2% $SiH_4$ balance argon; is introduced at a pressure of 120 mTorr and a power of 200 watts with a 5% total duty cycle for 5 seconds.
  Argon is introduced at 65 mTorr for 30 seconds at a pressure of 65 mTorr, with a power of 260 watts, with a duty cycle of 15%.
  Steps A and B are repeated once.
D) 2% $SiH_4$ is introduced at 150 mTorr for 30 seconds.
E) Blend layer: 2% $SiH_4$ with balance argon, tetramethylsilane (TMS) and $C_2H_2$ were introduced. $C_2H_2$ flow is gradually increased and $SiH_4$ flow and TMS flow are decreased over 4 minutes.
F) A DLC layer is deposited using $C_2H_2$ and Ar for 2 minutes.

The properties of this coating were: deposition rate=0.3 microns/min, hardness=15.5 GPa, thickness=2.3 microns, and the wear coefficient was 4.7 E-7 mm3/N-m using a 5 mm WC ball with a load of 5N under dry conditions. The scratch adhesion force (Lc3) measured 21.4N, in comparison the same process with a standard $SiH_4$ based adhesion layer deposited on the same type of SiC pipe, which measured 11.2 N, resulting in an increase of 91% in adhesion for the PEB process.

What is claimed is:

1. A method of coating an interior surface within a workpiece comprising:
    forming a first film on said interior surface from a first plasma under film deposition conditions within said workpiece, including establishing said film deposition conditions such that said first plasma is within said workpiece and ions from said first plasma form said first film; and
    exposing said first film to bombardment of ions from a second plasma under ion bombardment conditions within said workpiece, including establishing said ion bombardment conditions such that said second plasma is within said workpiece, said exposing further including providing plasma activation energy sufficient to induce reaction of said first film so as to bond with material of said workpiece as a consequence of inter-diffusion of material constituents of said first film with material constituents of said interior surface on which said first film was formed, said exposing being implemented to induce said reaction of said first film upon completion of said forming of said first film.

2. The method of claim 1 further comprising forming an outer coating, said first film being formed of a material selected at least partially on the basis of increasing adhesion to said outer coating as compared to adhesion if said outer coating were to be formed directly onto said interior surface within said workpiece.

3. The method of claim 2 wherein forming said outer coating is a step of depositing diamond-like carbon (DLC).

4. The method of claim 3 further comprising forming at least one blend layer prior to forming said outer coating so as to further increase adhesion of said DLC to said workpiece, such that said at least one blend layer is between said first film and said DLC.

5. The method of claim 1 wherein exposing said first film to bombardment includes etching said first film subsequent to completion of said forming of said first film.

6. The method of claim 1 wherein said ion bombardment conditions are established using an inert gas in forming said second plasma, such that chemistries of said first and second plasmas are different.

7. The method of claim 1 wherein forming said first film includes depositing said first film on a coating on said interior surface of said workpiece, said inter-diffusion including diffusion of material constituents of said first film and of said coating.

8. The method of claim 1 further comprising steps of:
    (a) depositing a second film on said first film following said exposing of said first film, said second film being substantially the same material as said first film; and
    (b) exposing said second film to ion bombardment from plasma under said ion bombardment conditions within said workpiece, including providing plasma activation energy sufficient to induce reaction of said second film so as to bond with material of said first film as a consequence of inter-diffusion of material constituents;
    wherein said step (b) begins following a period of time in which deposition of said material is terminated.

9. The method of claim 8 further comprising repeating steps (a) and (b) at least three times, but with respect to at least third, fourth and fifth films, each of said films having a thickness less than 20 nm and being substantially said same material, each execution of said step (b) being initiated only upon termination of said deposition of said material.

10. The material of claim 9 further comprising forming a DLC coating following said repeating of steps (a) and (b).

11. The method of claim 1 wherein forming said first film includes establishing said film deposition conditions such that hollow cathode effects occur within said workpiece, including coupling said workpiece to a source of pulsed power, said workpiece being formed of an electrically conductive material.

12. The method of claim 1 wherein said exposing of said first film is executed to induce formation of one of a silicide or a germanicide.

13. The method of claim 1 wherein inducing reaction of said first film is implemented such that said material constituents of said workpiece diffuse across an entirety of a thickness of said first film.

14. The method of claim 13 wherein establishing said plasma enhanced bonding conditions includes applying high power bursts to said workpiece.

15. A method of coating an interior surface within a workpiece so as to achieve a desired level of adhesion of a coating layer to said workpiece comprising:
  executing a deposition step of providing a plasma within an interior of said workpiece and depositing a first material on said interior surface from said plasma;
  executing an ion bombardment step following said deposition step, including using plasma exposure of said first material to provide high energy bursts of ions, said ion bombardment step having a longer duration than said deposition step;
  executing at least one additional cycle of said deposition and ion bombardment steps with respect to said first material; and
  depositing said coating layer.

16. The method of claim 15 wherein said deposition and ion bombardment steps include applying the hollow cathode effect within said interior of said workpiece.

17. The method of claim 15 wherein each said ion bombardment step includes partially etching said first material that was formed in a previous deposition step, said ion bombardment steps being non-overlapping with said deposition steps.

18. The method of claim 15 wherein each said deposition step is executed to provide a film thickness of 20 nm or less.

19. The method of claim 15 wherein the first said ion bombardment is initiated following the first said deposition step and includes causing said first material to diffuse into said workpiece, thereby forming a third material.

20. The method of claim 15 wherein the first ion bombardment is initiated following the first said deposition step and includes introducing species of said gas into said first material, thereby forming a third material.

21. The method of claim 15 wherein said ion bombardment step includes causing reaction of said first material so as to be structurally altered upon completion of said ion bombardment step.

22. The method of claim 15 wherein said deposition step includes depositing germanium and wherein said ion bombardment step includes providing an argon plasma within said interior.

23. The method of claim 15 wherein each said ion bombardment step includes exposing said first material to high energy bursts from said plasma using pulsed DC discharge.

24. The method of claim 15 wherein depositing said coating layer includes forming diamond-like carbon.

25. A method of coating an interior surface within a workpiece comprising:
  forming a first film on said interior surface from a first plasma under film deposition conditions within said workpiece;
  following termination of said film deposition conditions for forming said first film, exposing said first film to bombardment of ions from a second plasma under ion bombardment conditions within said workpiece, including providing said second plasma within said workpiece and providing plasma activation energy sufficient to induce reaction of said previously formed first film so as to bond with material of said interior surface as a consequence of chemical bonding of said first film with material of said interior surface on which said first was formed.

26. The method of claim 25 further comprising forming an outer coating, said first film being formed of a material selected at least partially on the basis of increasing adhesion to said outer coating as compared to adhesion if said outer coating were to be formed directly onto said interior surface within said workpiece.

27. The method of claim 26 wherein forming said outer coating is a step of depositing one of diamond-like carbon (DLC) and DLC alloyed with other elements.

28. The method of claim 27 further comprising forming at least one blend layer prior to forming said outer coating and subsequent to forming said first film so as to further increase adhesion of said DLC to said workpiece.

29. The method of claim 26 wherein exposing said first film to bombardment includes partially etching said first film.

30. The method of claim 25 wherein said ion bombardment conditions are established using an inert gas.

31. The method of claim 25 wherein forming said first film includes depositing said first film on a coating on said interior surface of said workpiece, said chemical bonding including diffusion of material constituents of said first film and at least one of said coating and a gaseous species.

32. The method of claim 25 further comprising steps of:
  (a) depositing a second film on said first film following said exposing of said first film, said second film being substantially the same material as said first film; and
  (b) exposing said second film to ion bombardment from plasma under said ion bombardment conditions within said workpiece, including providing plasma activation energy sufficient to induce reaction of said second film so as to bond with material of said firs film as a consequence of chemical bonding of material constituents;
  wherein said step (b) begins following a period of time in which deposition of said material is terminated.

33. The method of claim 32 further comprising repeating steps (a) and (b) at least three times, but with respect to at least third, fourth and fifth films, each of said film having a thickness less than 20 nm and being substantially said same material, each execution of step (b) being initiated only upon termination of deposition of said material.

34. The method of claim 33 further comprising forming a DLC coating following said repeating of steps (a) and (b).

35. The method of claim 25 wherein forming said first film includes establishing said film deposition conditions such that hollow cathode effects occur within said workpiece, including coupling said workpiece to a source of pulsed power, said workpiece being formed of an electrically conductive material.

36. The method of claim 25 wherein said exposing of said first film is executed to induce formation of one of a silicide or a germanicide.

37. The method of claim 25 wherein inducing reaction of said first film is implemented such that said material constituents of said workpiece diffuse across an entirety of a thickness of said first film.

38. The method of claim 37 wherein establishing said ion bombardment conditions includes applying high power bursts to said workpiece using pulsed DC discharge.

\* \* \* \* \*